US006437538B1

(12) United States Patent
Tsurumi et al.

(10) Patent No.: US 6,437,538 B1
(45) Date of Patent: Aug. 20, 2002

(54) BATTERY VOLTAGE MEASUREMENT APPARATUS

(75) Inventors: Takafumi Tsurumi; Tomohiko Maeda; Kouji Sakai; Naoki Ohsawa, all of Wako; Kazunori Sato, Tokyo, all of (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/690,481

(22) Filed: Oct. 18, 2000

(30) Foreign Application Priority Data

Oct. 21, 1999  (JP) ............................. 11-300205

(51) Int. Cl.$^7$ ................................. H02J 7/00
(52) U.S. Cl. ....................................... 320/116
(58) Field of Search .................... 320/118, 116

(56) References Cited

U.S. PATENT DOCUMENTS

| | | | | |
|---|---|---|---|---|
| 3,997,830 A | * | 12/1976 | Newell et al. ............... | 320/118 |
| 4,833,459 A | | 5/1989 | Geur et al. | |
| 5,049,834 A | * | 9/1991 | Kasai .......................... | 330/255 |
| 5,625,272 A | * | 4/1997 | Takahashi .................... | 320/116 |
| 5,652,501 A | * | 7/1997 | McClure et al. ............. | 320/118 |
| 5,818,201 A | * | 10/1998 | Stockstad et al. ........... | 320/116 |
| 6,157,165 A | * | 2/2000 | Kinoshita et al. ............ | 320/116 |
| 6,147,499 A | * | 4/2000 | Torii et al. ................... | 324/434 |
| 6,064,178 A | * | 5/2000 | Miller ......................... | 320/118 |
| 6,163,265 A | * | 12/2000 | Klippel ....................... | 340/660 |

FOREIGN PATENT DOCUMENTS

| | | |
|---|---|---|
| DE | 37 02 591 | 1/1987 |
| DE | 41 28 284 | 8/1991 |
| DE | 41 32 229 | 9/1991 |
| DE | 196 005 481 | 2/1996 |
| EP | 0 990 913 A1 | 4/2000 |
| JP | 61-125700 | 6/1986 |
| JP | 06-061813 | 3/1994 |
| JP | 08-140204 | 5/1996 |
| JP | 09-001617 | 1/1997 |
| JP | 11-113182 | 4/1999 |
| JP | 11-248755 | 9/1999 |
| JP | 11-248757 | 9/1999 |

OTHER PUBLICATIONS

Office Action of corresponding Japanese Patent Application No. Hei 11–300205, dated Jan. 8, 2002.
Office Action of corresponding German Patent Appln. No. 100519849.9–35, dated Feb. 8, 2002, with English translation.
Ebert, J., Jurres, E., Digitale Messtechnik, VEB Verlag Technik Berlin, $2^{nd}$ edition 1973, 1976, pp. 94–101.

* cited by examiner

Primary Examiner—Gregory Toatley
Assistant Examiner—P. Tibbits
(74) Attorney, Agent, or Firm—Armstrong, Westerman & Hattori, LLP

(57) ABSTRACT

An apparatus for measuring battery voltage is provided that can detect battery voltage with high accuracy, and also can be miniaturized with cost and noise reduced. The apparatus comprises: a capacitor which is charged to the voltage of each module, switches which connect and disconnect this capacitor and the module, a voltage follower which outputs the voltage across the capacitor, and switches which connect and disconnect the voltage follower and the capacitor. For the aforementioned switches, photo MOSFETs are used. Furthermore, to prevent discharge from the capacitor, a voltage follower is installed. Therefore, by using not a complicated circuit but inexpensive and simple elements, a low cost and miniaturized apparatus for measuring battery voltage is realized.

6 Claims, 4 Drawing Sheets

BATTERY VOLTAGE MEASUREMENT APPARATUS

BACKGROUND OF THE INVENTION

1. Field of the Invention

The present invention relates to an apparatus for measuring battery voltage. In particular the invention relates to an apparatus for measuring battery voltage that, where a battery cell is composed of a plurality of secondary batteries connected in series and a plurality of these battery cells are divided into groups of an appropriate number for modularization, detects the battery voltage of each module accurately.

This application is based on Japanese Patent Application No. Hei 11-300205 (Unpublished), the contents of which are incorporated herein by reference.

2. Description of the Related Art

Heretofore there is known a hybrid vehicle providing with a motor in addition to an engine as a drive source for vehicle running.

One type of such hybrid vehicle is a parallel hybrid vehicle where the motor assists the output from the engine. With this parallel hybrid vehicle, for example at the time of acceleration, the output from the engine is assisted by means of the motor, while at the time of deceleration, various control is carried out such as performing charging of a battery by deceleration regeneration, so that the remaining battery charge (state of charge) can be maintained while satisfying the requirements of the driver. Here, this battery, since high voltage is required, is normally composed of a plurality of battery cells connected in series.

Heretofore when detecting the voltage of this battery, a plurality of battery cells connected in series comprising the battery is divided into groups of an appropriate number for modularization, the voltage of each module is detected, and the sum of the detected voltages constitutes the voltage of the battery.

For the detecting circuit to detect this voltage, for example, a circuit in which a differential amplifier and an insulated type DC/DC converter are combined has been used (Japanese Unexamined Patent Application, First Publication No. Hei 11-113182)

However, with an apparatus for measuring battery voltage that is realized by using a differential amplifier and an insulated type DC/DC converter, the gain is limited by the common mode input voltage range of the amplifier used, and any error in the resistance used has a major influence on the accuracy of the whole amplifier. Therefore there is a drawback in that high accuracy is difficult.

Furthermore, when constructing this, the amplifier used for the differential amplifier is very expensive, and in addition a plurality of insulated type DC/DC converters is needed as a power source. Therefore there are disadvantages of high cost and also difficulty of miniaturization.

Moreover, in the case where a voltage measuring line of the battery is continuously connected to the battery voltage measuring circuit, since dark current of the circuit is associated with discharge of the electric charge of the battery, the circuit must be designed such that dark current is minimized. Therefore there are many design limitations in realizing a high accuracy apparatus for measuring voltage.

SUMMARY OF THE INVENTION

The present invention takes into consideration such conditions, with the object of providing an apparatus for measuring battery voltage that can detect battery voltage with high accuracy, and also can be miniaturized with cost and noise reduced. Furthermore, another object of the present invention is to provide an apparatus for measuring battery voltage that has lower dark current even when continuously connected to the secondary battery, and can thus minimize the voltage reduction of the secondary battery even after the secondary battery is left unused for a long time.

To achieve the aforementioned objects, the present invention is an apparatus for measuring battery voltage (voltage detecting circuit 20 in an embodiment), which divides a plurality of batteries (secondary battery 30) connected in series into a plurality of blocks (modules 10-1, 10-2, 10-N) comprising at least one battery, and measures the voltage of the blocks. It is characterized in that there is provided: a power storage element (capacitor 101) installed in parallel for each of the blocks; a voltage acquisition circuit (voltage follower 301) for obtaining an output voltage corresponding to the voltage across the power storage element; a first switching element group (switches 201 and 202) comprising a plurality of switching elements, which is inserted between the power storage element and the block for connecting the power storage element and the block in parallel; a second switching element group (switches 203 and 204) comprising a plurality of switching elements, which is inserted between the power storage element and the voltage acquisition circuit for connecting the power storage element and the voltage acquisition circuit; and a driver (CPU (central processing unit) 700) for switching the first switching element group and the second switching element group alternately.

With this construction, when detecting the voltage of a block, no expensive element needs to be used. Therefore it is possible to realize an apparatus for measuring battery voltage that can be miniaturized at low cost. Furthermore, after the voltage of the block has charged the capacitor, it is input via a voltage acquisition circuit (voltage follower 301 in the embodiment) to an A/D (analogue to digital) converter installed thereafter, thus enabling high accuracy voltage detection.

In addition, when a capacitor is charged to the same electric potential as the corresponding block, almost no current flows. Therefore the dark current can be reduced even when a voltage measuring line of the battery is continuously connected to the battery voltage measuring circuit. In this manner it is possible to minimize reduction of the charge of the battery even after the battery is left unused for a long time.

Furthermore, the driver of the present invention, at a time of switching the first switching element group and the second switching element group, after turning a switching element group which has been on off, turns the other switching element group on, and also when the first switching element group is on, after the voltage of the power storage element has reached the same voltage as the block, turns the first switching element group off.

By driving the switching elements in this manner, that is to say, by setting a period when all switching elements are off, it is possible to avoid a situation where all switching elements are on at the same time due to a factor such as variation in the speed of response. As a result, it is possible to detect the voltage of the block accurately according to a predetermined timing. Here, it is necessary to set a period when all switching elements are off that is longer than the speed of response of the switching elements used.

Furthermore, an input impedance of the voltage acquisition circuit is infinite. With this construction, with simple and miniature elements it is possible to detect a voltage with the least possible discharge of electric charge from the capacitor. In this manner, it is possible to measure the voltage to be measured more accurately. As a result, a low cost, miniaturized and high accuracy apparatus for measuring battery voltage can be realized.

Additionally, the switching elements are bidirectional and insulated from a power source for driving the switching elements, With the apparatus for measuring battery voltage of the present invention, the voltage across the block, after charging the capacitor, is input via the voltage follower to the A/D converter etc. installed thereafter. Here, since the input impedance of the voltage acquisition circuit is infinite, the electric charge stored in the capacitor is not discharged. Consequently, until the capacitor and the block are connected again, the electric charge corresponding to the previous voltage of the block is stored by the capacitor. Therefore, depending on the electric potential of the block and the electric charge that the capacitor holds, the capacitor may be charged or discharged. As a result, for a switching element to connect the block and the capacitor, a bidirectional switching element is necessary.

Moreover, when detecting the voltage of a high voltage system power supply unit, since high voltage is to be measured, voltage leakage thereby must be avoided. Therefore by using switching elements, whereby the power supply system to drive the switching elements and the circuit system to which the switching elements are connected are insulated, it is possible to insulate the circuit system and the drive system of the switching elements easily.

Furthermore, the switching elements are constituted by photo MOSFETs (Metal Oxide Semiconductor Field Effect Transistors). Here, photo MOSFETs are components that are electrically insulated from the power supply system that drives the photo MOSFETs. Accordingly, it is possible to insulate the power supply system that drives the switching elements and the high voltage system such as a battery. For example, heretofore in the case when applied to an electric vehicle or the like, an insulated type DC/DC converter etc. has been used to insulate the 12V battery system, being a power source to drive the photo MOSFETs, and the battery system for the high voltage system comprised of batteries to be measured. Here, by using a photo MOSFET instead of this DC/DC converter, it is possible to insulate the power source system and the battery voltage system with an inexpensive and miniaturized element. Therefore, the circuit construction can be simplified, so that it is also possible to achieve cost reduction and miniaturization of the circuit.

Furthermore, in the case where the battery voltage is lower than the electric potential of the capacitor, discharge is performed from the capacitor to the battery, so that a bi-directional switch such as a photo MOSFET is suitable. Moreover, since the voltage drop of this photo MOSFET at the time of current flow is small, it is possible to output the battery voltage to the voltage detecting circuit accurately.

Furthermore, the voltage acquisition circuit of the present invention may be comprised of a voltage follower. Therefore, with simple and miniaturized elements, it is possible to remove the noise factor of the voltage to be measured from the capacitor. As a result, a low cost, miniaturized and high accuracy apparatus for measuring battery voltage can be realized. Additionally, since the voltage of the block is input via the voltage follower (a constant voltage circuit) to the circuit such as an A/D converter installed thereafter, an accurate voltage is detected as the voltage of the block with noise removed.

DETAILED DESCRIPTION OF THE PREFERRED EMBODIMENTS

Figure 1:
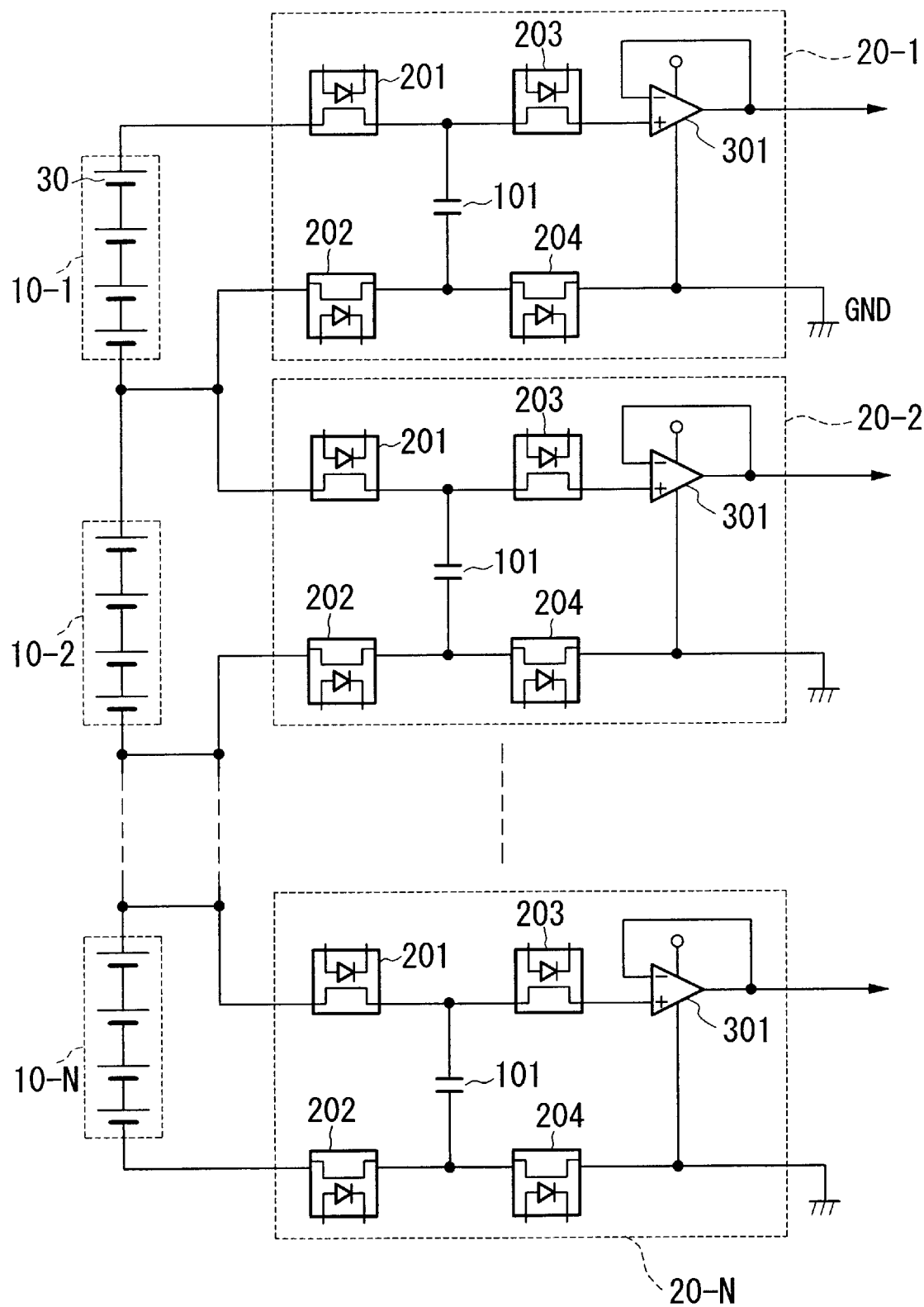
FIG. 1 is a block diagram showing the structure of an apparatus for measuring battery voltage according to an embodiment of the present invention.

Hereunder is a description of embodiments of the present invention, with reference to the figures. FIG. 1 is a block diagram showing the configuration of a measuring apparatus for battery voltage in an embodiment of the present invention. In this figure, numeral 30 denotes a secondary battery being the object to be measured, and a plurality of secondary batteries 30 is connected in series to compose a module 10. A plurality of these modules 10 (10-1 through 10-N) is connected in series, to constitute, for example, a power storage unit. Numeral 20 (20-1 through 20-N) denotes a voltage detecting circuit installed in correspondence to each of the modules 10 (10-1 through 10-N), and connected respectively to modules 10 (10-1 through 10-N) in parallel.

This voltage detecting circuit 20 (20-1 through 20-N) comprises: a capacitor 101 connected to the module 10 in parallel, a voltage follower 301 connected to the positive electrode of the capacitor 101, switches 201 and 202 which are inserted between the module 10 and the capacitor 101 and are connected to the positive electrode and the negative electrode of the module 10 respectively, and switches 203 and 204 which are inserted between the voltage follower 301 and the capacitor 101 and are connected to the two electrodes of the capacitor 101. Here, the aforementioned voltage follower 301 is an op-amp (operational amplifier) whose amplification factor is "1", and whose input voltage is output directly to the output terminal.

Figure 2A:
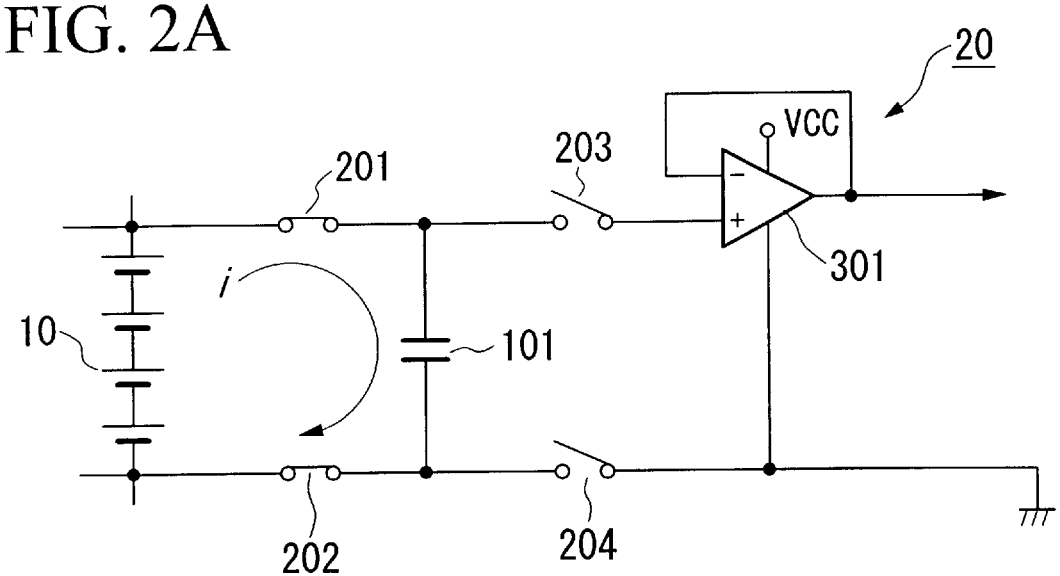
FIGS. 2A through 2C are diagrams for describing the operation of the apparatus for measuring battery voltage in the embodiment.
Figure 2B:
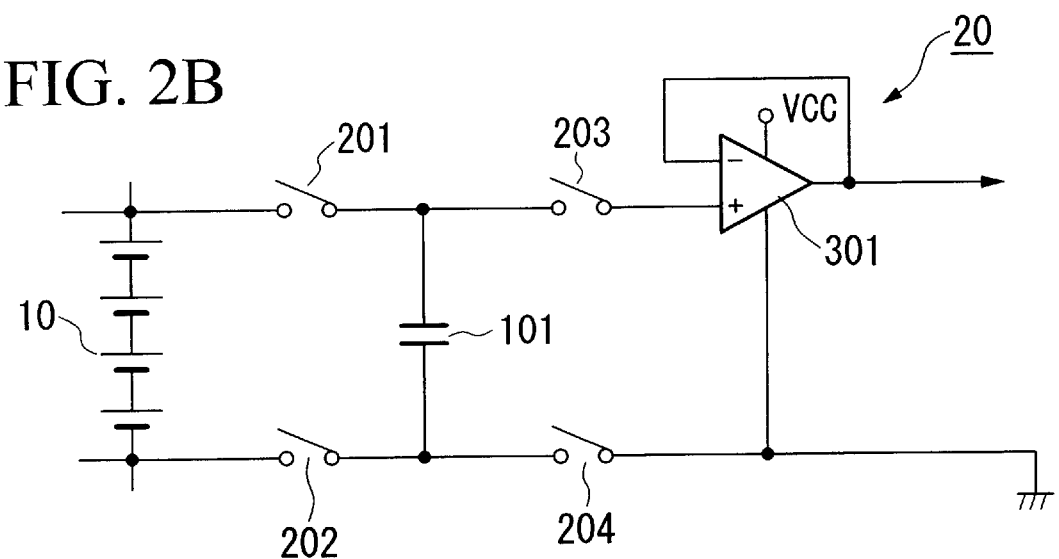
Figure 2C:
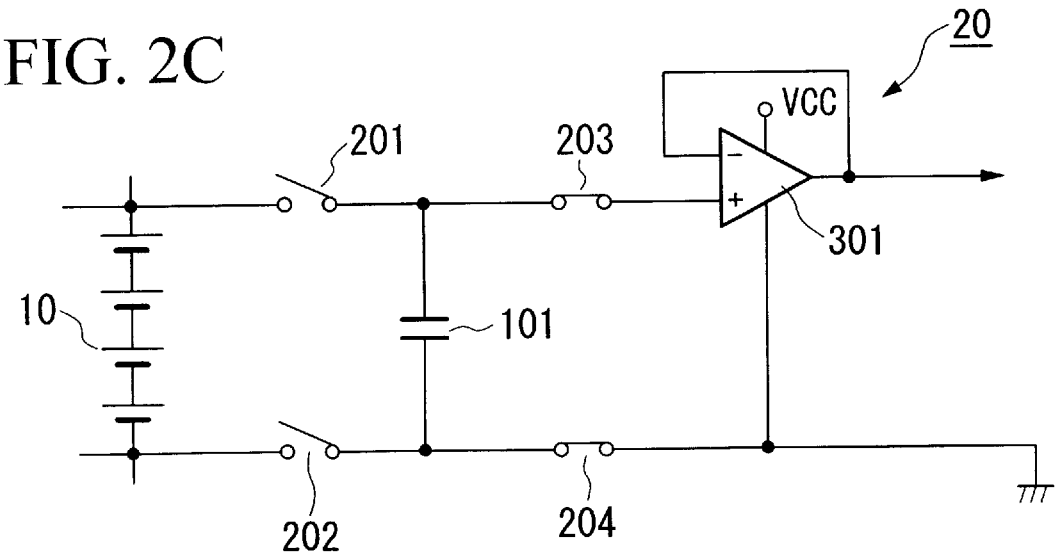
Figure 3:
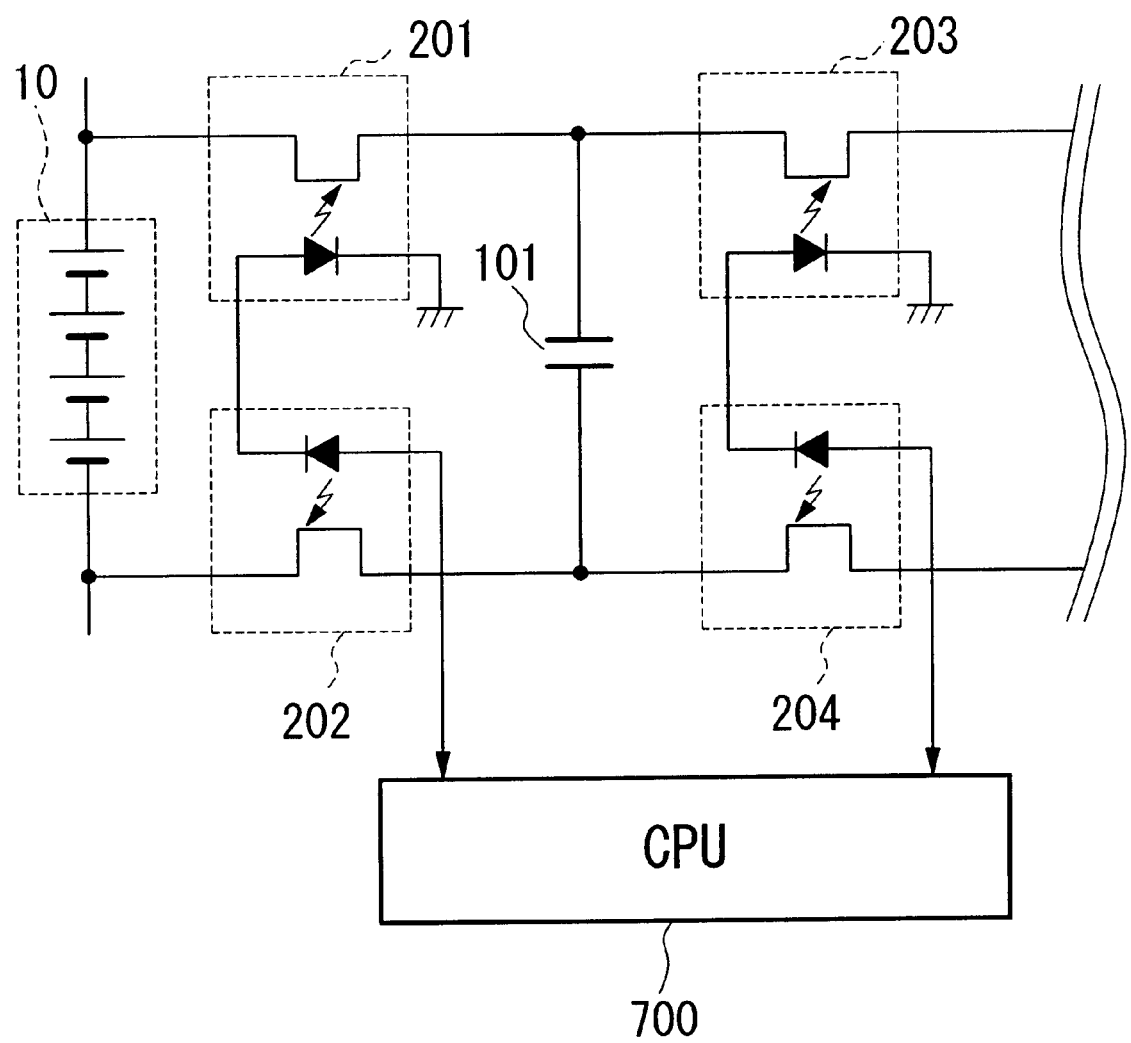
FIG. 3 is a schematic circuit diagram showing the construction of a photo MOSFET used for switches 201 through 204 in the embodiment.

Next is a description of the operation of the voltage detecting circuit of the above construction with reference to FIGS. 2A through 2C. Here, all of the switches 201 through 204 are driven by a CPU 700 (refer to FIG. 3) installed externally. The details will be described later.

First, as shown in FIG. 2A, the switches 201 and 202 are turned on, and the switches 203 and 204 are turned off. In this manner, the module 10 and the capacitor 101 becomes a closed circuit connected in parallel, and the voltage of the module 10 charges the capacitor 101. When the voltage of the capacitor 101 reaches the same voltage as the module 10 and current stops flowing in this closed circuit, then based on a predetermined timing the switches 201 and 202 that had been on are turned off (refer to FIG. 2B). Here, at this time the switches 203 and 204 remain off.

Subsequently, after a predetermined period, the switches 203 and 204 are turned on based on a predetermined timing (refer to FIG. 2C). At this time, the switches 201 and 202 remain off. In this manner, the voltage corresponding to the voltage across the capacitor 101 appears at the output of the voltage follower 301 connected thereafter. This voltage follower 301, as mentioned above, has infinite input impedance, so that current does not flow in the closed circuit formed by turning the switches 203 and 204 on. Consequently, no voltage drop occurs through resistance, which means that the voltage across the capacitor 101 appears at the output of the voltage follower 301 with an amplification factor of "1".

Then, the output of the voltage follower 301 is transformed into a digital signal by an A/D converter etc. connected after the voltage follower 301. This digital signal is read by a microcomputer (omitted from the figure) etc., thereby detecting the voltage of each module. Also by computing the voltage value of each module, the voltage of the battery as a whole can be detected.

Then, at the next timing, by turning the switches 203 and 204 off, all switches 201 through 204 are turned off. Then after a predetermined period the switches 201 and 201 are turned on.

Here, at this time in the case where the electric potential of the capacitor 101 is higher than the electric potential of the module 10, the capacitor 101 discharges to the module 10. Accordingly, it is necessary for the switches 201 and 202 to be bidirectional so as to accommodate the charge and discharge of the capacitor 101.

In this manner, the CPU 700 installed externally repeats the series of operations mentioned above at a predetermined timing, so that it is possible to detect the voltage of the module at the predetermined timing.

Furthermore, by driving the switches mentioned above for all the modules 10 (10-1 through 10-N) at the same timing, it is possible to detect the voltages of all modules 10 (10-1 through 10-N) at the same time.

On the other hand, by sequentially driving the switching of each module at different timing, it is also possible to detect the voltages of module 10-1 through 10-N sequentially based on a predetermined timing.

Furthermore, since there is variation in the speed of response of the switches, then even though the drive signals for the switches are output alternately, there is a case where switching on and off becomes slow due to the speed of response. If the speed of response of the switch to the driving signal of the switch is slow such that all switches 201 through 204 are turned on, the voltage of the module 10 (10-1 through 10-N) cannot be detected.

To avoid this situation, a step is provided as shown in FIG. 2B, so that a situation where switches 201 through 204 are all on at the same time due to variations in the speed of response is avoided.

Accordingly, it is necessary to set the period when all switches 201 through 204 are turned off, to longer than the speed of response of the switches 201 through 204 used.

Next is a description of a construction and a drive method for a photo MOSFET used for the aforementioned switches 201 through 204.

The aforementioned switching elements comprise MOSFETs which turn on and off in response to light, and light emitting elements such as LEDs (light emitting diodes) which emit light. These light emitting elements such as LEDs are driven by the CPU 700 installed externally. To be specific, the CPU 700 installed externally outputs, for example, a rectangular wave signal of 0V through 5V, and current flows through the light emitting elements in response to this voltage. Consequently the light emitting elements emit light, and the MOSFETs are driven in response to this light.

Furthermore, the cathodes of the LEDs are grounded.

The aforementioned photo MOSFETs are bi-directional and the light emitting elements are power sources. The MOSFETs, unlike photo couples, are electrically insulated.

Since current flows bi-directionally, the switching elements used for the aforementioned switches 201 through 204 need to be bi-directional. Furthermore, the power supply system that drives the switches, and the MOSFETs being the switches in the apparatus for measuring battery voltage, must be insulated so that they can be adapted even in the case where the voltage of the battery to be measured is high.

Accordingly, photo MOSFETs which can insulate from the power supply system and which are bidirectional switching elements, are suitable for the switches 201 through 204 of the present embodiment.

Furthermore, instead of photo MOSFETs, any switching elements that meet the aforementioned conditions could be substituted. Moreover, the switches 203 and 204 that connect the capacitor 101 and the voltage follower 301 in FIG. 1, since there is no current flow, do not need to be bidirectional as long as they are insulated from the power supply system that drives the switches. Therefore, photo couplers etc. can also be used. In this case, since there is a possibility that the speed of response of switches is different, it is necessary to set a long period when all switches are turned off.

Furthermore, photo MOSFETs have a characteristic in that the voltage drop that occurs when the current flows is small. Accordingly, a problem such as Vcesat (collector-emitter saturation voltage) which occurs when using phototransistors or the like can be solved. As a result, it is possible to detect the voltage of a battery accurately.

Here, in the aforementioned embodiment, a voltage follower is used as the voltage acquisition circuit. However, without using a voltage follower, it is possible to directly connect to an A/D converter that detects voltage, or instead of the voltage follower, a differential amplifier, an inverting amplifier, a non-inverting amplifier and the like may be used.

Here, in the aforementioned embodiment, a module in which a plurality of battery cells is connected is mentioned. However, this could be a single battery cell.

Moreover, in the aforementioned embodiment, the capacitor 101 may be an electric double layer capacitor. Furthermore, a small capacitance capacitor or a power storage element comprised of electric double layer capacitors connected in series may be used. Thus any construction, as long as it can store enough voltage corresponding to a block, may be used.

Furthermore, the present invention is not limited to this embodiment, and the embodiment can be implemented with appropriate modifications within a scope that does not change the gist of the present invention.

Next is a description of a case where, as an application example of the apparatus for measuring battery voltage of the present invention, this is applied to detect the voltage of a battery in a parallel hybrid vehicle, with reference to figures.

Figure 4:
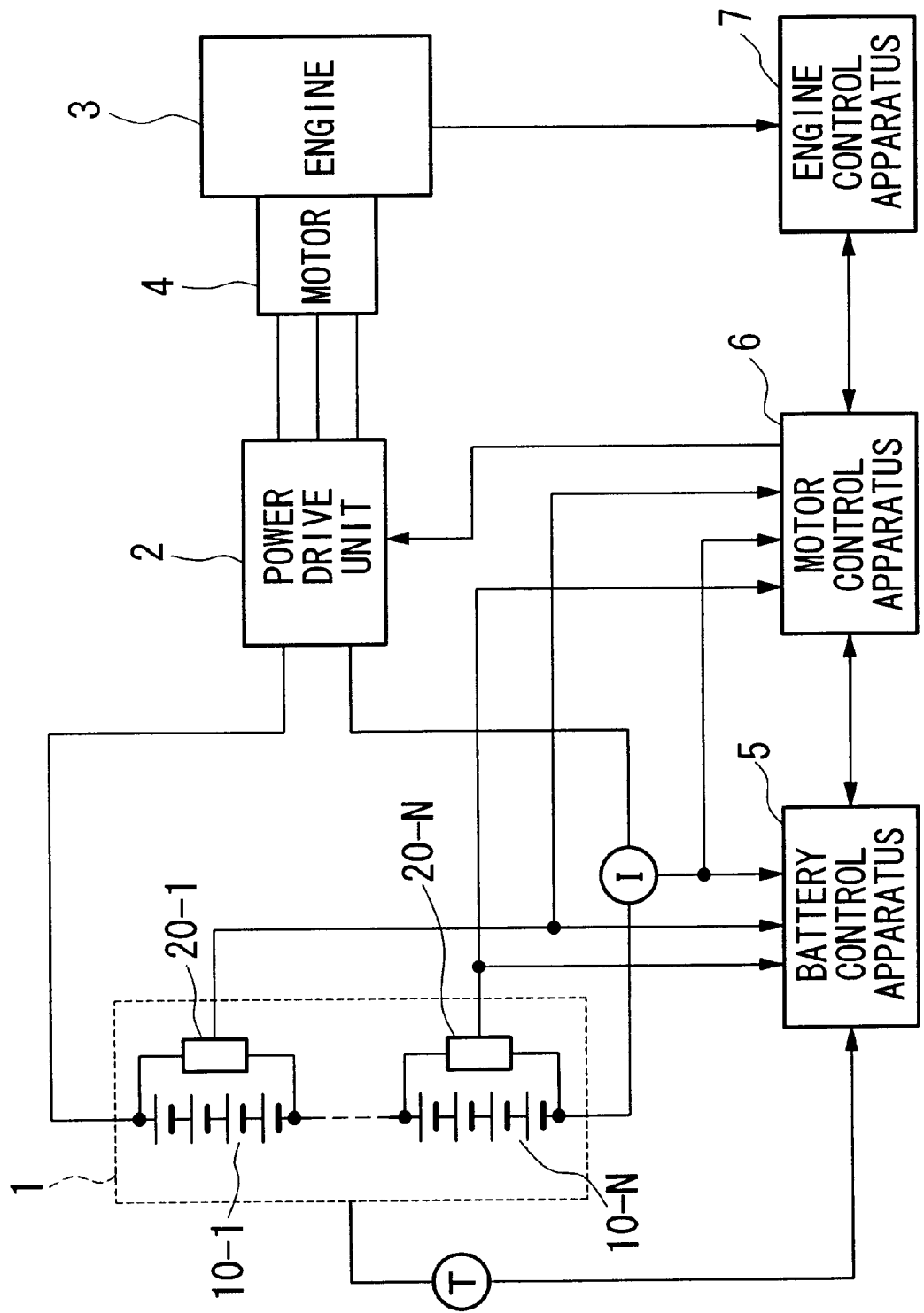
FIG. 4 is a block diagram showing the overall construction of a parallel hybrid vehicle, being a kind of hybrid vehicle.

FIG. 4 shows a block schematic diagram of a parallel hybrid vehicle. In this figure, numeral 1 denotes a high voltage system battery. This is constructed from individual modules 10 (10-1, 10-2 . . . ) where a plurality of cells is connected in series, with a plurality of these modules connected in series. A voltage detecting circuit 20 (20-1, 20-2 . . . ) for detecting voltages is installed in each module (10-1, 10-2 . . . ), and the voltage value of each module detected by this voltage detecting circuit is output to a battery control apparatus 5.

Furthermore, a current sensor for detecting the current that flows in the battery 1, and a temperature sensor for detecting the temperature of the battery 1, according to a predetermined timing, detect the current and the temperature respectively, and output these values to the battery control apparatus 5.

Numeral 2 denotes a power drive unit, which is constructed such that three pairs of serially connected two switching components are connected in parallel.

Numeral 3 denotes an engine, which is driven by fuel combustion energy, and numeral 4 denotes a motor, which is used together with engine 3 and is driven by electric energy. The driving force from both the engine 3 and the motor 4 is transmitted to driving wheels (not shown in the figure), via an automatic transmission or a manual transmission (not shown in the figure). Furthermore, at the time of deceleration of the hybrid vehicle, a driving force is transmitted to the motor 4 from the driving wheels. The motor 4 functions as a generator to produce so called regenerative braking force, and charges the battery 1. Here a construction may also be such that, besides the motor 4 for driving, a generator for charging the battery 1 is provided.

The drive and regeneration of the motor 4 are performed by the power drive unit 2, which receives control instructions from a motor control apparatus. To be specific, the switching elements in the power drive unit 2 are turned on and off by the motor control apparatus 6, so that electric power from the battery I is supplied to the motor 4 via a three-phase line, or regenerative electric power from the motor 4 is supplied to the battery 1.

Numeral 5 denotes the battery control apparatus, which receives the voltage V (V1 through Vn) of each module comprising the battery 1 from the voltage detecting circuit 20 (20-1 through 20-N), also receives, from the current sensor, battery current Ibatt flowing from the battery 1, and also receives temperature Tbatt of the battery 1 at a predetermined timing, and computes the remaining battery charge SOC of the battery 1 from these output values.

Numeral 7 denotes an engine control apparatus, which monitors engine speed NE, vehicle speed and the like every predetermined period to determine modes such as motor regeneration, assistance and deceleration. At the same time, the engine control apparatus 7 determines the assistance/regeneration amount from the result of the aforementioned mode determination and from the remaining battery charge SOC transmitted from the battery control apparatus 5.

Here, the battery control apparatus 5, the motor control apparatus 6 and the engine control apparatus 7, which are each composed of a CPU (Central Processing Unit) and memory, realize their functions by running a program to realize the function of the control apparatuses.

In the hybrid vehicle with the aforementioned construction, the voltage detection of the battery 1 will be described.

First, based on a predetermined timing, the battery control apparatus 5 outputs a signal for turning the switches 201 and 202 on, to the voltage detecting circuit 20. When the switches 201 and 202 are turned on by this signal, the module 10 and the capacitor 101 become a closed circuit connected in parallel, and the voltage of the module 10 charges the capacitor 101. Then, after the voltage of the capacitor 101 reaches the same voltage as the voltage of the module 10 and no current flows in this closed circuit, the battery control apparatus 5, based on a predetermined timing, outputs a signal for turning the switches 201 and 201 which had been on, off, to the voltage detecting circuit 20. Based on this signal, all switches 201 through 204 are turned off.

Subsequently, after a predetermined period, based on a predetermined timing, the battery control apparatus 5 outputs a signal for turning the switches 203 and 204 on, to the voltage detecting circuit 20. At this time, the switches 201 and 202 remain off. In this manner the electric charge stored in the capacitor 101, via the switch 203 which is conducting, is input to the input terminal of the voltage follower 301 connected thereafter. Then, by the voltage follower 301, the input voltage is output with an amplification factor of "1". That is to say, the same voltage as the input voltage is output to the output terminal of the voltage follower 301. Then, the output from the voltage follower 301 is input to the battery control apparatus 5. The battery control apparatus 5, by reading this output, detects the voltage of the battery 1, and also detects the remaining charge of the battery 1 from the values of the battery current Ibatt and the battery temperature Tbatt received at the same time.

In this manner, with a high accuracy voltage detecting circuit, by detecting the voltage of the battery, it is possible to control each part of the hybrid vehicle with high accuracy. Furthermore, the apparatus for measuring battery voltage of the present invention is small sized and inexpensive so that it is also possible to achieve cost reduction by using this apparatus for measuring the voltage of the batteries.

What is claimed is:

1. An apparatus for measuring a battery voltage, which divides a plurality of batteries connected in series into a plurality of blocks comprising at least one battery, and measures the voltage of said blocks, comprising:

a power storage element installed in parallel for each of said blocks;

a voltage detecting circuit for obtaining an output voltage corresponding to the voltage across said power storage element;

a first switching element group comprising a plurality of switching elements, which is inserted between said power storage element and said block for connecting said power storage element and said block in parallel;

a second switching element group comprising a plurality of switching elements, which is inserted between said power storage element and said voltage detecting circuit for connecting said power storage element and said voltage detecting circuit; and a driver for switching said first switching element group and said second switching element group, for driving all the switching elements belonging to said first switching element group at the same time, and for driving all the switching elements belonging to said second switching element group at the same time;

wherein said driver, after turning said first switching element group on and turning said second switching element group off, when the voltage across said power storage element reaches the same voltage as said blocks, turns said first switching element group off for a predetermined period time so that said first and second switching element groups are turned off for the predetermined period of time, and then turns said second switching element group on.

2. An apparatus for measuring a battery voltage according to claim 1, wherein said voltage detecting circuit is comprised of an operational amplifier whose input impedance is extremely high.

3. An apparatus for measuring a battery voltage according to claim 1, wherein said switching elements are bi-directional and insulated from a power source for driving said switching elements.

4. An apparatus for measuring battery voltage according to claim 2, wherein said switching elements are constituted by photo MOSFETs.

5. An apparatus for measuring a battery voltage according to claim 1, wherein said driver sets the period when all switching element groups are turned off, to longer than any one of the periods corresponding to the speeds of response of said first and second switching clement groups.

6. An apparatus for measuring a battery voltage according to claim 1, wherein said voltage detecting circuit is installed in correspondence to each of said blocks.

* * * * *

UNITED STATES PATENT AND TRADEMARK OFFICE
CERTIFICATE OF CORRECTION

PATENT NO.    : 6,437,538 B1
DATED         : August 20, 2002
INVENTOR(S)   : Tsurumi et al.

It is certified that error appears in the above-identified patent and that said Letters Patent is hereby corrected as shown below:

<u>Title page,</u>
Item [73], Assignee, change "Honda Giken Kogyo Kabushiki Kaisha, Tokyo (JP)" to be -- Honda Giken Kogyo Kabushiki Kaisha, Tokyo (JP); Keihin Corporation, Tokyo (JP) --

Signed and Sealed this

Twentieth Day of May, 2003

JAMES E. ROGAN
*Director of the United States Patent and Trademark Office*